US010404495B2

(12) United States Patent
Isomura

(10) Patent No.: US 10,404,495 B2
(45) Date of Patent: Sep. 3, 2019

(54) RINGING SUPPRESSION CIRCUIT

(71) Applicant: DENSO CORPORATION, Kariya, Aichi-pref. (JP)

(72) Inventor: Hirofumi Isomura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/196,096

(22) Filed: Nov. 20, 2018

(65) Prior Publication Data

US 2019/0089559 A1 Mar. 21, 2019

Related U.S. Application Data

(63) Continuation of application No. PCT/JP2017/013942, filed on Apr. 3, 2017.

(30) Foreign Application Priority Data

May 31, 2016 (JP) ................................ 2016-109030

(51) Int. Cl.

| | |
|---|---|
| ***H04L 25/02*** | (2006.01) |
| ***B60R 16/023*** | (2006.01) |
| ***H04L 12/40*** | (2006.01) |
| ***H03K 19/003*** | (2006.01) |
| *H03K 5/24* | (2006.01) |

(52) U.S. Cl.

CPC .......... *H04L 25/028* (2013.01); *B60R 16/023* (2013.01); *H03K 19/00369* (2013.01); *H04L 12/40* (2013.01); *H04L 25/02* (2013.01); *H04L 25/0272* (2013.01); *H03K 5/24* (2013.01); *H04L 2012/40215* (2013.01); *H04L 2012/40273* (2013.01)

(58) Field of Classification Search

CPC ... H04L 25/0272; H04L 25/0296; H04B 3/42; H04B 3/20; H04M 9/082

USPC ..................................... 375/346; 379/406.04

See application file for complete search history.

(56) References Cited

U.S. PATENT DOCUMENTS

| | | | | |
|---|---|---|---|---|
| 8,045,626 | B2 | 10/2011 | Iwasaki | |
| 2011/0169547 | A1* | 7/2011 | Suzuki ............ | H03K 19/00361 327/384 |
| 2012/0293230 | A1 | 11/2012 | Mori et al. | |

FOREIGN PATENT DOCUMENTS

| | | |
|---|---|---|
| JP | H07-038966 A | 2/1995 |
| JP | 4767025 B2 | 9/2011 |
| JP | 2013-098871 A | 5/2013 |

* cited by examiner

*Primary Examiner* — Kevin Kim

(74) *Attorney, Agent, or Firm* — Posz Law Group, PLC

(57) ABSTRACT

A ringing suppression circuit is provided at one or more nodes each having a communication circuit executing communication with another node by transmitting a differential signal through a pair of communication lines connected to the nodes. The operation controller is configured to shift a mode of the suppressor to a normal-operation mode when the differential signal is transmitted through the pair of communication lines, and to shift the mode of the suppressor to a low-current operation mode when the differential signal is not transmitted through the pair of communication line. A current consumption of the suppressor is less in the low-current operation mode than the normal-operation mode. The suppressor and the operation controller are configured to receive permanent power from a DC power supply, and the communication circuit is configured to receive power from the DC power supply via a power supply switch.

10 Claims, 13 Drawing Sheets

(a) WAVEFORM OF ECU (NODE N2) AT TRANSMITTING SIDE (b) WAVEFORM OF ECU (NODE N3) AT RECEIVING SIDE (c) WAVEFORM OF ECU (NODE N1) WITHOUT RINGING SUPPRESSION FUNCTION

RINGING SUPPRESSION CIRCUIT

CROSS REFERENCE TO RELATED APPLICATIONS

The present application is a continuation application of International Patent Application No. PCT/JP2017/013942 filed on Apr. 3, 2017, which designated the U.S. and claims the benefit of priority from Japanese Patent Application No. 2016-409030 filed on May 31, 2016. The entire disclosures of all of the above applications are incorporated herein by reference.

TECHNICAL FIELD

The present disclosure relates to a ringing suppression circuit configured to suppress the occurrence of ringing in a differential signal transmitted through a pair of communication lines.

BACKGROUND

When transmitting a digital signal through a transmission line, a waveform distortion (i.e., overshoot or undershoot) known as ringing may occur in the signal due to signal reflection when the signal level changes. A variety of techniques have been proposed for suppressing the waveform distortion.

SUMMARY

The present disclosure provides a ringing suppression circuit suppressing an oscillation in a differential signal transmitted through a pair of communication lines connected to the ringing suppression circuit.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
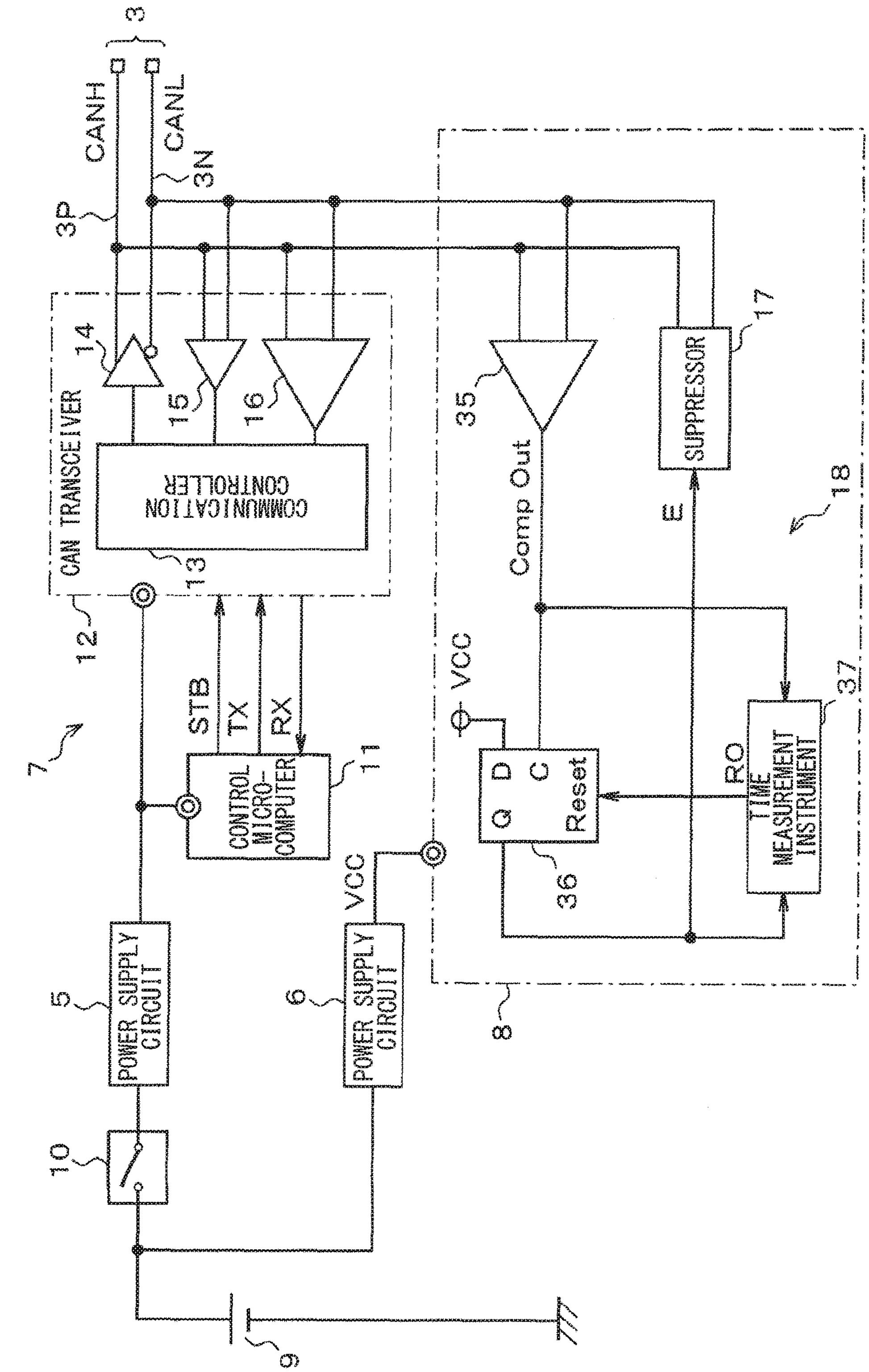
FIG. 1 illustrates the configuration of a node having a ringing suppression circuit according to a first embodiment.

When transmitting a digital signal through a transmission line including a pair of communication lines, a waveform distortion (i.e., overshoot or undershoot) known as ringing may occur in the signal received at a receiver due to signal reflection at the timing during which the signal's level has been changing. A variety of techniques have been proposed for suppressing the waveform distortion.

For example, one or several restrictions have been added to, for example, a bus topology in an in-vehicle LAN to minimize the waveform distortions for saving cost without using a large-sized impedance matching circuit, which tends to have a higher cost of implementation. However, with only the technique described above, it is not adequate to suppress the waveform distortions in a situation of an increase in a number of electronic control units (hereinafter referred to as "ECU"), which are connected to the bus topology.

For example, a ringing suppression circuit may be configured with a simpler structure to suppress ringing for enhancing the communication fidelity. For this ringing suppression circuit, a switching element is provided in a communication bus and is configured to be turned on with a predetermined time period when a change in a signal's level is detected.

When the above-mentioned ringing suppression circuits are respectively provided for all of the electronic control units (hereinafter referred to as "ECU"), that is, all of the nodes in an in-vehicle LAN, it is possible to robustly suppress the occurrence of ringing in all of the nodes. Even if the ringing suppression circuits are provided for one group of the nodes, the effect for minimizing the occurrence of ringing in the other group of the nodes not provided with the ringing suppression circuits may still be attained.

However, the following situation may happen when the ringing suppression circuits are provided for only one group of nodes as described above. With regard to the field of vehicle installation, a power supply from a battery to an ECU is cut off for reducing consumption current when an ignition switch is turned off. Accordingly, when a power supply to the node, which is provided with the ringing suppression circuit, is cut off, communication may be executed at the other node, which is not provided with the ringing suppression circuit. In this situation, ringing occurred in the communication may not be suppressed, and therefore the communication may not be stable.

A permanent power supply may be provided for the nodes provided with the ringing suppression circuit regardless of an ON/OFF status of a power supply switch, which is in operation with the ignition switch, so as to enhance the fidelity of communication in which the function of the ringing suppression circuit is permanently exhibited. However, in this situation, an increase in dark current may happen.

This disclosure provides a ringing suppression circuit that suppresses a dark current flowing at the timing during which a power supply switch is turned off while maintaining higher communication fidelity even when the power supply switch is turned off.

The ringing suppression circuit is provided at a node having a communication circuit for carrying out communication with another node by transmitting a differential signal through a pair of communication lines. The ringing suppression circuit includes a suppressor and an operation controller. The suppressor is configured to suppress ringing occurred with a transmission of the differential signal. The operation controller is configured to determine whether the communication is executed. Additionally, the operation controller is configured to shift a mode of the suppressor to a normal-operation mode in response to determining the communication being executed. The normal-operation mode enables the suppressor to suppress ringing in the differential signal. Moreover, the operation controller is configured to shift the mode of the suppressor to a low-consumption current operation mode in response to determining the communication not being executed. The low-current operation mode enables the suppressor to operate in lower current consumption as compared with the normal-operation mode. The suppressor and the operation controller are configured to receive permanent power a DC power supply, and the communication circuit is configured to permanently receive power from the DC power supply through a path provided with a power supply switch.

According to the above configuration, when it is determined that the communication is executed, in other words, when the suppressor executes the normal mode operation in a situation of having a higher probability of ringing occurrence, the ringing can be suppressed. Since the permanent power supply is supplied by the DC power source to the suppressor and the operation controller for controlling the suppression of ringing, the suppressor and the operation controller can execute the suppression of ringing in a situation where the communication is executed even when the power supply switch is at the off state. In addition, when the suppressor is determined that the communication is not executed, the suppressor is shifted to the low-current operation mode. Therefore, it is possible to reduce the dark current when the power supply switch is off and the communication is not executed. Accordingly, the above-mentioned configuration is possible to reduce the dark current while maintaining the fidelity of communication even when the power supply switch is off.

Hereinafter, several embodiments of the present disclosure will be described with reference to the drawings. In the following embodiments, substantially identical elements will be indicated by the same reference sign and the explanation thereof will not be omitted.

(First Embodiment)

The first embodiment of the present disclosure is described with reference to FIGS. 1 to 8.

Figure 2:
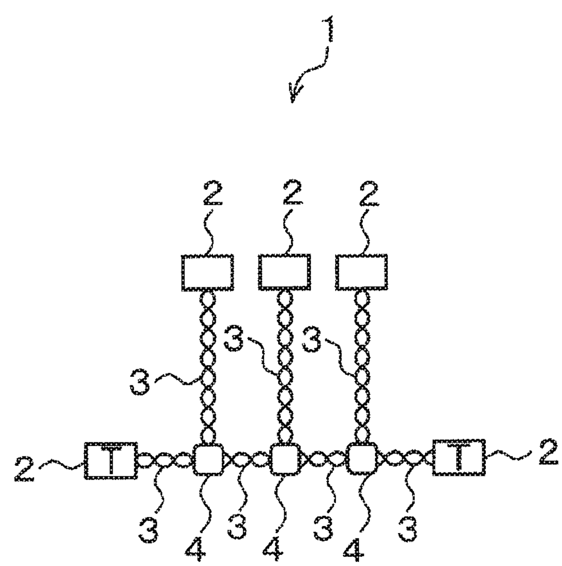
FIG. 2 illustrates the configuration of a communication network.

A communication network 1 illustrated in FIG. 2 is connected to a plurality of nodes 2, which are mounted to a vehicle, via the transmission line 3 for controlling communication among the nodes 2. The transmission line 3 is configured by a twisted pair line. Each node 2 (hereinafter referred to as the "ECU 2") is an electronic control device that controls an actuator based on a sensor-type device or a sensor configured to detect each vehicle state.

A communication circuit (not shown) is provided at each node 2. The communication protocol in the transmission line 3 converts the transmission data or receiving data to a communication signal according to, for example, CAN protocol and executes communication with the other node 2. A branch connector 4, which is used for branching the transmission line 3, is provided at the transmission line 3. Some of the nodes 2 are provided with a ringing suppression circuit configured to suppress unwanted oscillation such as ringing.

As illustrated in FIG. 1, the ECU 2 includes a power supply circuit 5, a power supply circuit 6, a communication circuit 7 and a ringing suppression circuit 8. The power supply circuit 5 is in operation by receiving power supply from the battery 9, which is mounted to a vehicle, via a power supply switch 10 to generate operation power supply for the communication circuit 7. The power supply circuit 6 is in operation by receiving direct power supply from the battery to generate operation power supply for the ringing suppression circuit 8.

Accordingly, the power supply is permanently provided from the battery 9 to the ringing suppression circuit 8. The power supply is provided from the battery 9 to the communication circuit 7 through the power supply switch 10. The battery 9 is a battery mounted to a vehicle, and it corresponds to a direct power supply. The power supply switch 10 is turned on and off in conjunction with the ignition switch of the vehicle.

The communication circuit 7 includes a control microcomputer 11 and a CAN transceiver 12. The control microcomputer 11 controls the overall operation of communication executed by the ECU 2, and transmits a standby signal STB and transmitting data TX to the CAN transceiver 12. The control microcomputer 11 receives the receiving data RX from the CAN transceiver 12.

The CAN transceiver 12 includes a communication controller 13, a transmission buffer 14, and a reception buffer 15 and a comparator 16. The communication controller 13 generates a signal based on the transmitting data TX from the control microcomputer 11, and transmits the signal to the transmission line 3 having a high-potential signal line SP (CANH) and a low-potential signal line 3N (CANL) via the transmission buffer 14. The high-potential signal line 3P and the low-potential signal line 3N correspond to a pair of communication lines, and hereinafter are referred to as a signal line 3P and a signal line 3N for simplicity.

The communication controller 13 receives a signal, which is transmitted from the other node 2 through the transmission line 3, through the reception buffer 15, and transmits the signal as the receiving data RX to the control microcomputer 11. The communication controller 13 shifts the CAN transceiver 12 to a standby state according to the standby signal STB sent from the control microcomputer 11.

The comparator for detecting a WakeUP state is configured to detect the presence or absence of a WakeUP pattern, and the signal of the transmission line 3 is inputted to each input terminal of the comparator 16. The communication controller 13 determines the absence or presence of the WakeUP pattern, and then notifies of the signal level in the transmission line 3 to the control microcomputer 11 when the communication controller 13 determines that the WakeUP pattern is present. In this situation, the communication controller 13 changes the state of the terminal for transmitting the receiving data RX so as to notify of the signal level in the transmission line 3 to the control microcomputer 11. When the control microcomputer 11 determines that the WakeUP pattern is present based on the state of the terminal, the control microcomputer 11 changes the standby signal STB and restores the CAN transceiver 12 from the standby state and then activates the CAN transceiver 12.

The ringing suppression circuit 8 includes a suppressor 17 and an operation controller 18. The suppressor 17 lowers the impedance of the transmission line 3 to carry out an operation for suppressing ringing occurred with the transmission of a differential signal. An enable signal E is sent from the operation controller 18 to the suppressor 17.

The suppressor 17 is shifted to a normal mode in response to being provided by the power supply for operation during which the enable signal E is at a high level. The suppressor 17 is shifted to a sleep mode in response to the power supply for operation being cut off during which the enable signal E is at the low level. The normal mode corresponds to a normal operation state in which a normal operation is executable. The sleep mode corresponds to a low current operation state operated with a lower current consumption as compared with the normal operation state.

Figure 3:
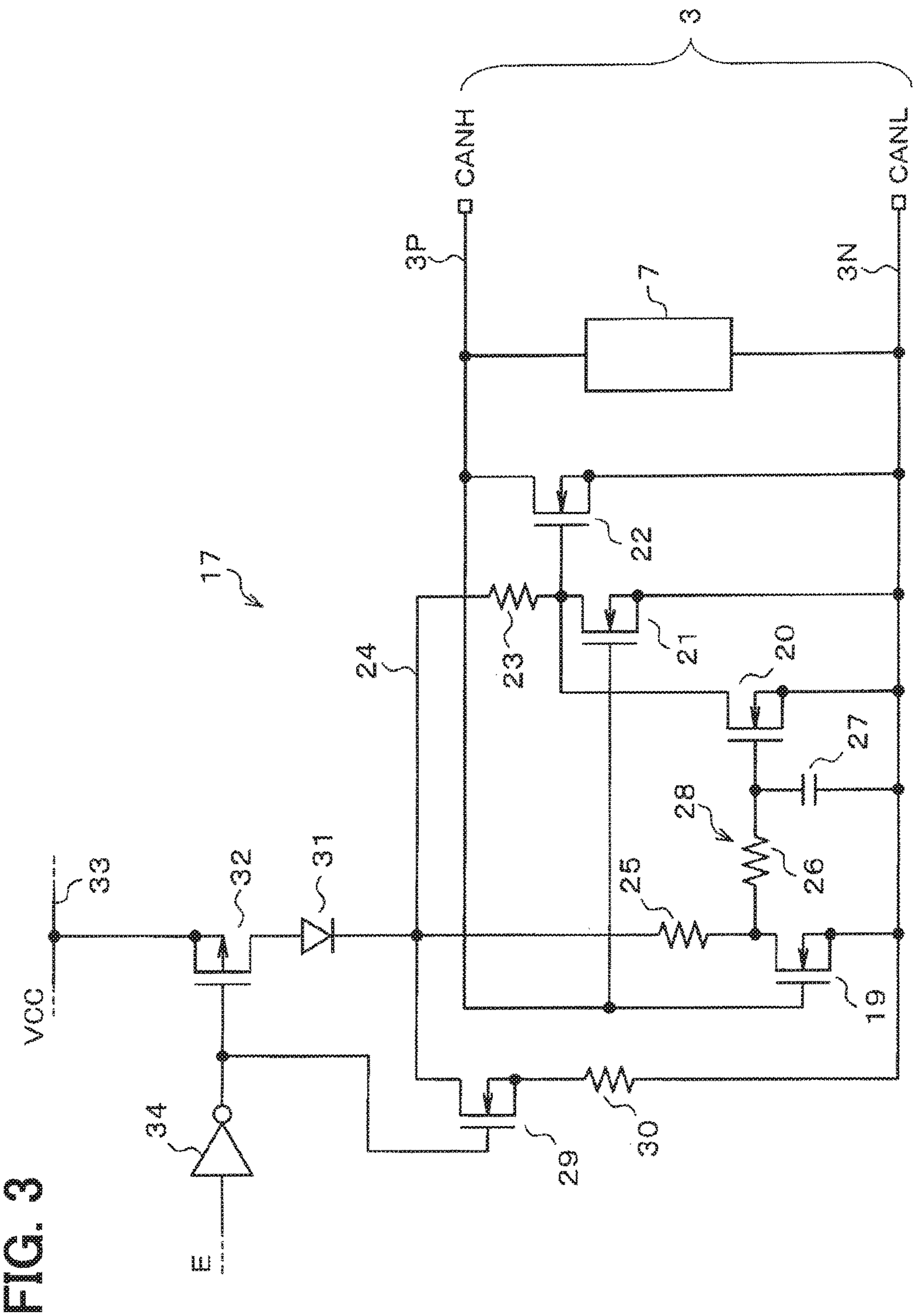
FIG. 3 illustrates the configuration of a suppressor.

The particular configuration of the suppressor 17 may use the one illustrated in FIG. 1 of JP 5498527 B2. It is noted that the present disclosure additionally includes the configuration for switching the operation based on the after-mentioned enable signal E. The configuration of the suppressor 17 according to the present embodiment is illustrated in FIG. 3. According to this configuration, the operation state is switched based on the after-mentioned enable signal E. As illustrated in FIG. 3, the suppressor 17 includes four transistors 19 to 22, which are N-channel type MOSFETs. The source of each transistor is connected to the signal line 3N.

The gate of each of the transistors 19 and 21 is connected to the signal line 3P. The drain of the transistor 22 is connected to the signal line 3P. The drain of each of the transistors 20 and 21 is connected to the gate of the transistor 22 and is connected to a power supply line 24 through a resistor 23.

The drain of the transistor 19 is connected to the power supply line 24 through a resistor 25, and is connected to the gate of the transistor 20 through a resistor 26. The gate of the transistor 20 is connected to the signal line 3N through a capacitor 27. The resistor 26 and the capacitor 27 are provided in an RC filter 28.

The above configuration is similar to the one illustrated in FIG. 1 of JP 5498527 B2. The following describes a configuration for switching the operation states based on the enable signal E. The drain of the transistor 29, which is an N-channel MOSFET, is connected to the power supply line 24. The source of the transistor is connected to the signal line 3N through the resistor 30. The cathode of the diode 31 is connected to the power supply line 24. The anode of the diode 31 is connected to the drain of the transistor 32, which is a P-channel MOSFET.

The source of the transistor 32 is connected to the power supply line 33. The power supply voltage VCC for operation is generated by the the power supply circuit 6, and is provided to the power supply line 33. The inverter 34 receives an input of the enable signal E and outputs an inverted signal of the enable signal E. The output signal of the inverter 34 is provided to the respective gates of the transistors 29 and 32.

The suppressor 17 switches its operation state based on the enable signal E as described in the following. When the enable signal E is at the high level, the transistor 32 is turned on and the transistor 29 is turned off. The power supply voltage VCC is provided to the power supply line 24. Accordingly, the suppressor 17 is in a normal mode in which a normal operation for suppressing the ringing can be executed.

On the other hands, when the enable signal E is at the low level, the transistor 32 is turned off and the transistor 29 is turned on. The power supply line 24 and the signal line 3N are at the same potential level. Accordingly, the suppressor 17 cannot execute the normal operation for suppressing the ringing. Therefore, the current consumption is extremely small. In other words, when the enable signal E is at the low level, the suppressor 17 is in a sleep mode in which the current consumption is lower as compared with the normal mode.

As illustrated in FIG. 1, the operation controller 18 includes a comparator 35, a D-type flip flop (hereinafter referred to as "D-F/F") 36 and a time measuring instrument 37. The operation controller 18 shifts the suppressor 17 to the normal mode when the operation controller 18 determines that the communication is executed. The operation controller 18 shifts the suppressor 17 to the sleep mode when the operation controller 18 determines that the communication is not executed.

The comparator 35 monitors the state of the transmission line 3, that is, the communication bus to detect the presence or absence of communication. The respective signals of the signal lines 3P and 3N are sent to the respective input terminals of the comparator 35. The signal CompOut, which is output from the comparator 35, is at the low level when the signal of the differential signal, that is, the communication bus indicates a recessive level, and the signal CompOut is at the high level when the communication bus indicates a dominant level. The signal CompOut is provided to a clock terminal C of the D-F/F 36 and the time measuring instrument 37.

The power supply voltage VCC is input to the input terminal D of the D-F/F 36. The signal output from the output terminal Q of the D-F/F 36 is provided as the enable signal E to the suppressor 17 and the time measuring instrument 37. The reset terminal Reset of the D-F/F 36 receives a reset signal RO, which is output from the time measuring instrument 37.

The time measuring instrument 37 changes the signal CompOut from the high level to the low level when the enable signal E is at the high level, and starts an operation for measuring the predetermined time from this time point. Until the time measuring instrument 37 finishes the operation of measuring the predetermined time, the time measuring instrument 37 resets the measuring operation when the signal CompOut is changed to be at the high level. In this situation, the operation of measuring the predetermined time is again started from the time at which the signal CompOut is again changed to be at the low level. When the time measuring instrument 37 finishes the operation of measuring the predetermined time, the time measuring instrument 37 changes the reset signal RO to be at the high level. When the enable signal E is changed to be at the low level, the reset signal RO is changed to be at the low level from the high level.

Figure 4:
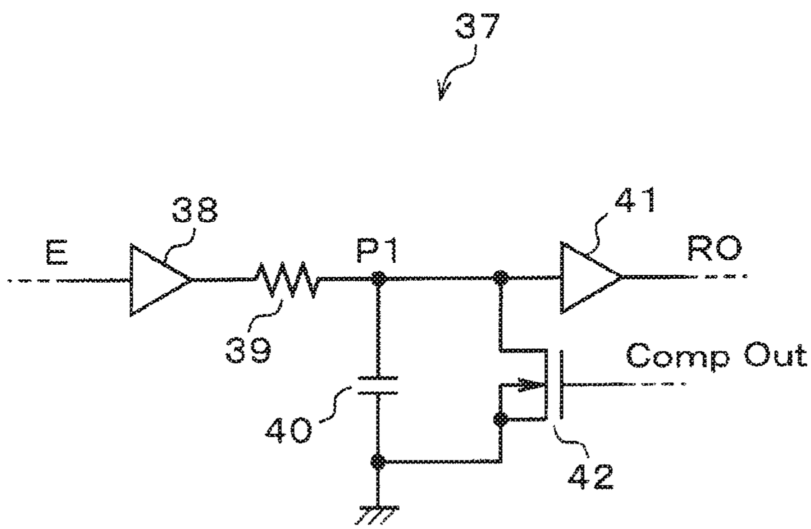
FIG. 4 illustrates the configuration of a time measuring instrument.

The configuration of the time measuring instrument 37 may refer to, for example, the configuration illustrated in FIG. 4. As illustrated in FIG. 4, the time measuring instrument 37 includes an input buffer 38, a resistor 39, a capacitor 40, an output buffer 41 and a transistor 42. The enable signal E, which is input through the input buffer 38, is provided to one of the terminals of the resistor 39. The other of the terminals of the resistor 39 is connected to a ground as a reference potential level of the circuit through the capacitor 40.

The terminal voltage P1 of the capacitor 40 is provided to the output buffer 41. The output buffer 41 sets the output to be at the high level when the input is larger than or equal to the predetermined threshold value, and sets the output to be at the lower level when the input is less than the threshold value. The output of the output buffer 41 is output as the reset signal RO to the D-F/F 36. The transistor 42 is an N-channel MOSFET. The drain and source are respectively connected to two terminals of the capacitor 40. The transistor 42 opens and closes the two terminals of the capacitor 40 based on the signal CompOut provided to the gate of the transistor 42.

According to the above configuration, when the enable signal E is at the high level and the signal CompOut is at the low level, the charging of the capacitor 40 is executed so that the terminal voltage P1 rises. The terminal voltage P1 reaches the threshold value of the output buffer 41, the reset signal RO is changed to be at the high level. In the above-mentioned configuration, the measurement of the predetermined time is executed based on the charging of the capacitor 40.

In the above-mentioned configuration, when the signal CompOut is changed to be at the high level during the charging of the capacitor 40, that is, during the measurement of the predetermined time, the path between the two terminals of the capacitor 40 is short-circuited and then the terminal voltage P1 is zero. The measurement of the predetermined time is reset.

Figure 5:
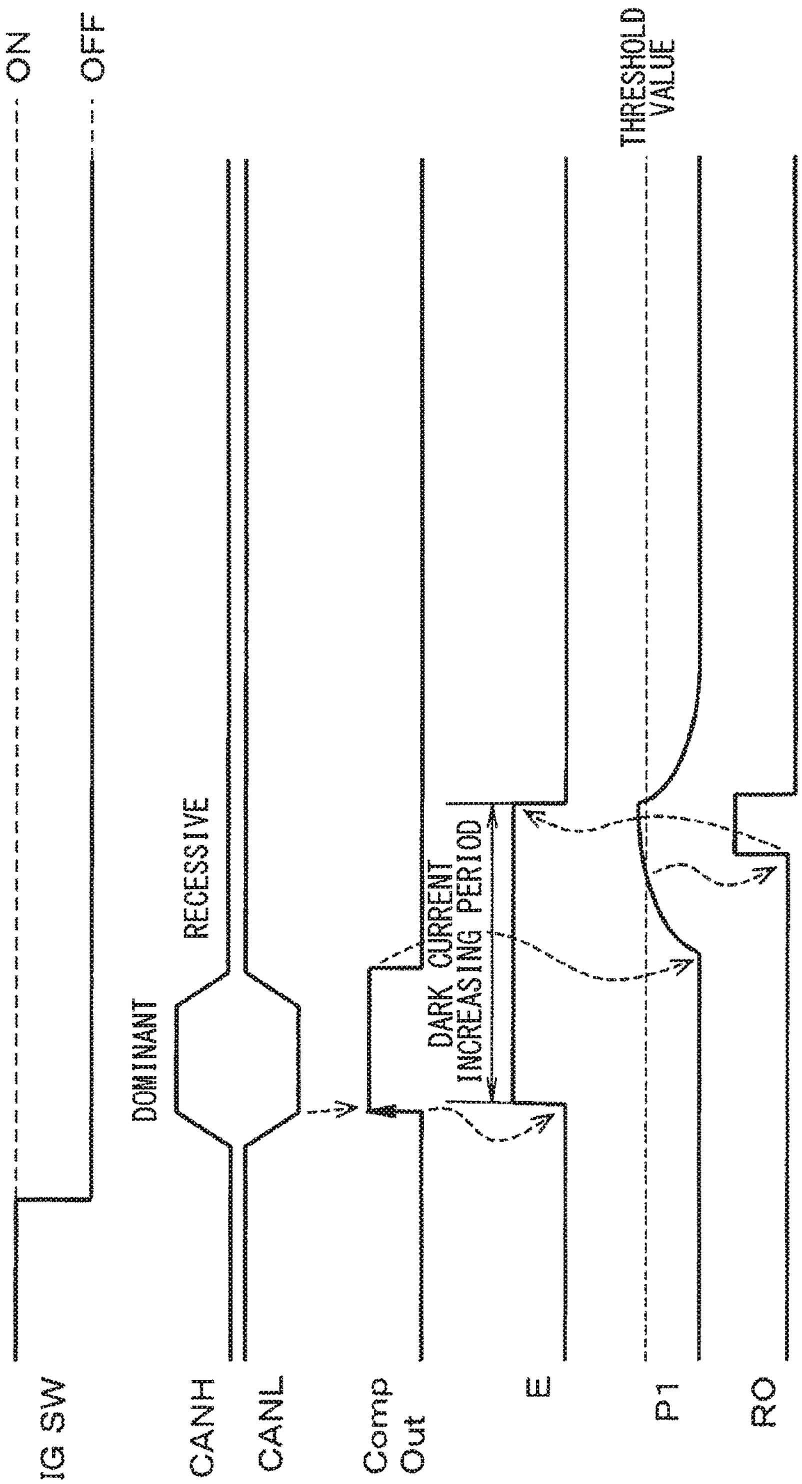
FIG. 5 is a timing chart that illustrates each waveform in a situation where communication is executed when an ignition switch is turned off.

The operation of the above configuration is described with the timing chart illustrated in FIG. 5.

When the ignition switch is turned off (IGSW: ON→OFF), the power supply switch 10 is also turned off. Thus, the power supply to the communication circuit 7 is cut off. However, the power supply from the power supply circuit 6 to the ringing suppression circuit 8 is continuously executed.

When the ignition switch is at the off state, the signal CompOut is changed to be at the high level when the communication bus is changed from the recessive level to the dominant level in a situation where the communication is executed between other nodes 2. Therefore, the enable signal E is changed to be at the high level, and the suppressor 17 is shifted to the normal mode. With regard to the above-mentioned configuration, the suppressor 17 determines that the presence of communication through the communication bus when the suppressor 17 is shifted to the normal mode for executing the suppression of ringing.

Subsequently, when the communication is changed from the dominant level to the recessive level, the signal CompOut is changed to be at the low level. Accordingly, the time measuring instrument 37 starts to charge the capacitor 40. In other words, the time measuring instrument 37 starts to measure the predetermined time. After the measurement of the predetermined time is started, when the terminal voltage P1 of the capacitor 40 reaches the threshold value of the output buffer 41 without having a change of the communication bus to be at the dominant level, in other words, when the measurement of predetermined time is complete, the reset signal RG is changed to be at the high level. Then, the enable signal E is changed to be at the low level, and the suppressor 17 is shifted to the sleep mode.

According to the above-mentioned configuration, when it is determined that the communication is not executed on the communication bus in a situation where the ignition switch is at the off state, the suppressor 17 is shifted to the sleep mode to reduce the current consumption. The current necessary for the operation of the comparator 35 for determining the presence or absence of communication on the communication bus is consumption current, that is, a dark current.

When the communication bus is changed to the dominant level after the measurement of the predetermined time is started, the signal CompOut is changed to be at the high level and the path between the terminals of the capacitor 40 is short-circuited. The measurement of the predetermined time is reset. In other words, the measurement of the predetermined time is initialized. In this situation, the communication bus is changed to be at the recessive level from the dominant level. The measurement of the predetermined time is again executed after the signal CompOut is turned to be at the low level.

According to the present embodiment described above, the following effects can be obtained.

As described above, even when the ringing suppression circuit is provided at some of the nodes 2 in the communication network, it is possible to suppress the ringing occurred in the node 2 where the ringing suppression circuit 8 is not provided. The following describes the effects with reference to the simulation result of the circuit operation.

Figure 6:
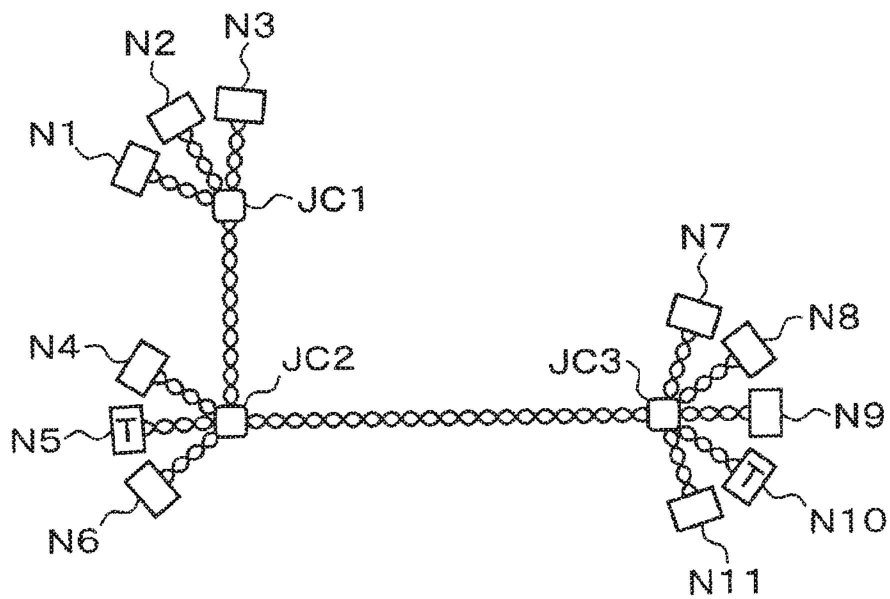
FIG. 6 illustrates a commutation network model used for simulation of a circuit operation.

FIG. 6 illustrates the communication network model with the use of simulation. Three nodes N1 to N3 are connected to a branch connector JC1 through the transmission line. Three nodes N4 to N6 are connected to a branch connector JC2 through the transmission line. The branch connector JC1 and the branch connector JC2 are connected through the transmission line. Five nodes N7 to N11 are connected to a branch JC3 through the transmission line. The branch connector JC2 and the branch connector JC3 are connected through the transmission line, The nodes N1 to N4, N6 to N9 and N11 are ECUs without electrical termination. The node 5 and node 10 are ECUS with electrical termination.

Figure 7:
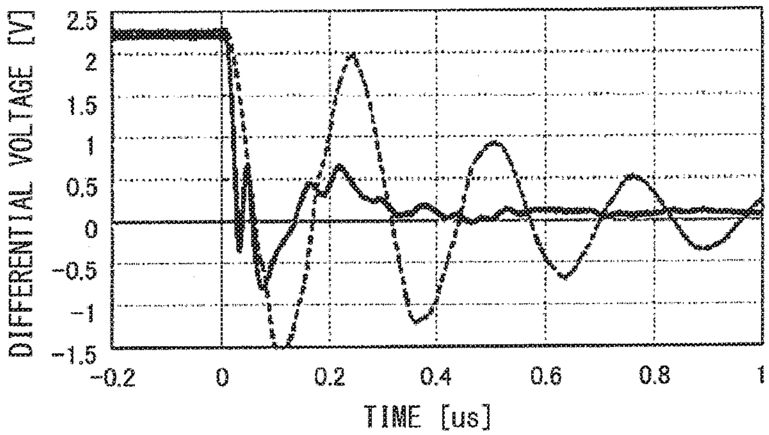
FIG. 7 illustrates the simulation result of the circuit operation.
Figure 7:
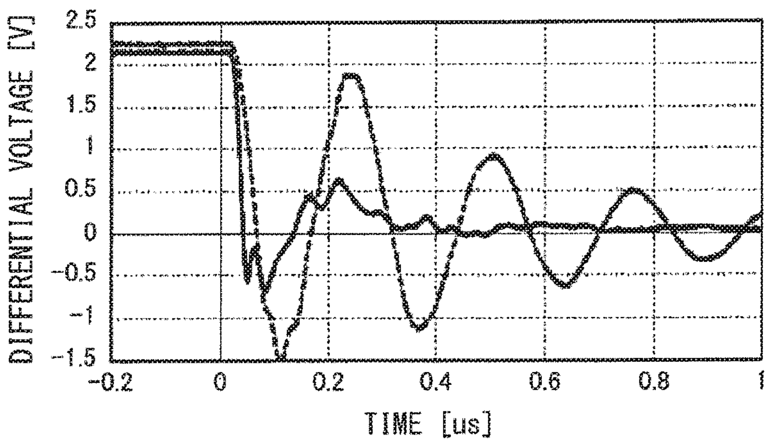
Figure 7:
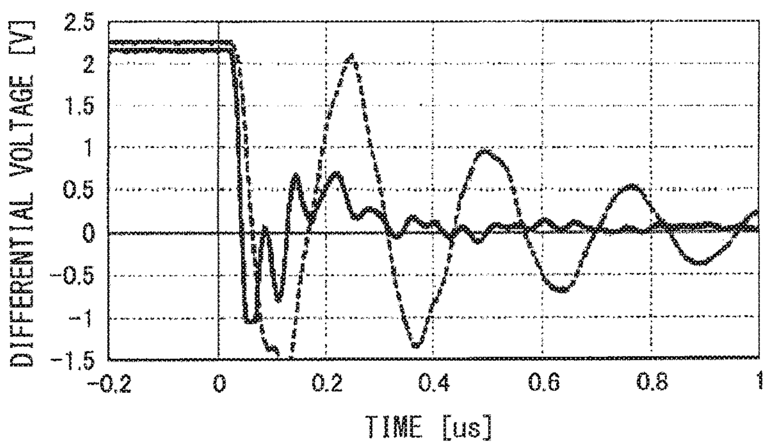

When the ringing suppression circuit 8 is provided at some of the nodes 1 to 11, in particular, only the nodes 2 and 3, the waveform of the differential voltage at the transmission line 3 is formed as illustrated with a solid line in FIG. 7. With regard to the comparative example for illustrating the confirmation of the effects of ringing suppression, FIG. 7 illustrates the waveform of the differential voltage at the transmission line 3 without having the ringing suppression circuit 8 at all of the nodes N1 to N11 with a broken line. In this situation, the node N2 is a transmitting node, and the node N3 is a receiving node, (a) in FIG. 7 illustrates a waveform of the differential voltage at the node N2. (b) in FIG. 7 illustrates a waveform of the differential voltage at the node N3. (c) in FIG. 7 illustrates a waveform of the differential voltage at the node N1.

As illustrated in (a), (b) and (c) of FIG. 7, it is understood that the ringing occurred with the transmission of the differential signal is suppressed not only at the nodes 2 and 3 but also the node 1. The nodes 2 and 3 are provided with the ringing suppression circuit 8 while the node 1 is not provided with the ringing suppression circuit 8.

For this reason, it is considered to provide the ringing suppression circuit 8 at some of the nodes 2 in the communication network 1. In this situation, it is preferable to provide the ringing suppression circuit 8 for at least part of the nodes N1 to N4, N6 to N9 and N11 which are not terminated. Since the nodes N5 and N10 have electrical termination, the ringing does not occur easily at the nodes N5 and N10. More specifically, it is more preferable to provide the ringing suppression circuit to at least a part of nodes having a higher ringing suppression effect as compared with other nodes among the nodes which are not terminated. It is possible to confirm whether the ringing effect is enhanced or not by the simulation or the like.

As described above, when the ringing suppression circuit 8 is provided at some of the nodes 2 in the communication network 1, the communication may be unstable when the communication is executed between the nodes, which are not provided with the ringing suppression circuit, in a situation where the power supply to the nodes provided with the ringing suppression circuit 8 is cut off. However, the above-mentioned difficulty can be solved by the ringing suppression circuit 8 according to the present embodiment.

In other words, the communication circuit 7 is supplied with power from a path via the power supply switch 10, which is turned on and off in conjunction with the ignition switch, from the battery 9. The ringing suppression circuit 8 is supplied with the permanent power supply from the battery 9. The ringing suppression circuit 8 includes the suppressor 17 for executing the ringing suppression and the operation controller 18 for controlling the operation of the suppressor 17. The operation controller 18 determines the presence or absence of the communication. When the operation controller 18 determines that the communication is executed on the communication bus, the operation controller 18 shifts the suppressor 17 to the normal mode, which can execute the normal operation. Even when the communication is executed at other nodes 2 in a situation where the ignition switch is at the off state, it is possible to suppress the ringing occurred with the communication.

When the operation controller 18 determines that the communication is not executed on the communication bus, the operation controller 18 shifts the suppressor 17 to the sleep mode. Therefore, the consumption current in the ringing suppression circuit 8 is suppressed to be lower when the ignition switch is at the off state and the communication is not executed between other nodes 2. According to the present embodiment, the communication fidelity can be maintained while minimizing the dark current when the ignition switch is at the off state.

According to the configuration related to the present embodiment, it is possible to avoid many restrictions of the typical bus topology. For example, with regard to a part of the communication network 1, it is possible to change from the star-topology transmission line shown at the left side in FIG. 8 to the star-topology transmission line as shown at the right side in FIG. 8. As a result, it is possible to reduce the number of wire harnesses used for connecting the nodes or the manufacturing cost.

Figure 8:
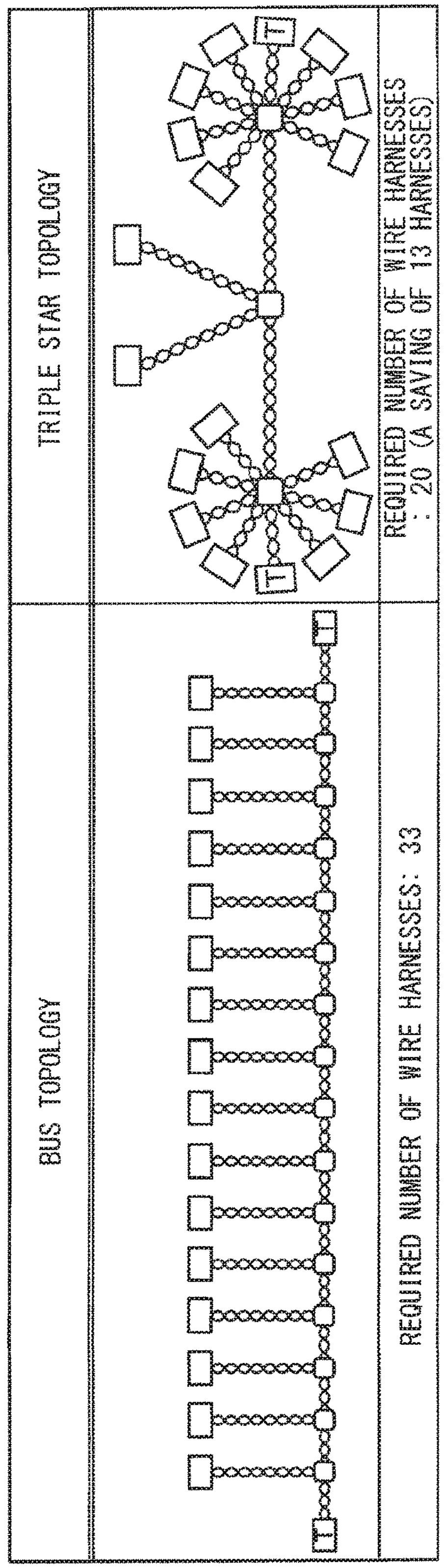
FIG. 8 illustrates a comparison between the number of wire harnesses used in a bus-topology transfer path and the number of wire harnesses used in a star-topology transfer path.

In FIG. 8, each of rectangular symbols in the network indicates an ECU (or node), and each of square symbols indicates a branch connector. The "T" in the rectangular symbol indicates the ECU having electrical termination.

When the communication is started in the communication network 1, the transmission line 3 is driven by one of the nodes 2, and the signal level of the differential signal is changed to be at the level indicating a dominant state. When the operation controller 18 detects a change in the state of the communication bus from the recessive level to the dominant level, the operation controller 18 determines that the communication has started. Accordingly, when the communication is started, the suppressor 17 can be promptly shifted to the normal mode.

When the communication is not executed in the communication network 1, the transmission line 3 is not driven, and the signal level of the differential signal is at the level indicative of the recessive state. The operation controller 18 determines that the communication is continuously executed when the communication bus is at the dominant state. Accordingly, the operation controller 18 determines whether the communication is continuously executed after the suppressor 17 is shifted to the normal node. The operation controller 18 can properly set the operation mode of the suppressor 17 based on the determination result.

(Second Embodiment)

The second embodiment will be described with reference to FIG. 9.

With regard to the first embodiment, a comparator for detecting the presence or absence of the communication is provided to each of the communication circuit 7 and the ringing suppression circuit 8. However, a single comparator may be shared by the communication circuit 7 and the ringing suppression circuit 8. It is required to provide a permanent power supply from the battery to the common comparator. The present embodiment illustrates an example of the above-mentioned configuration.

Figure 9:
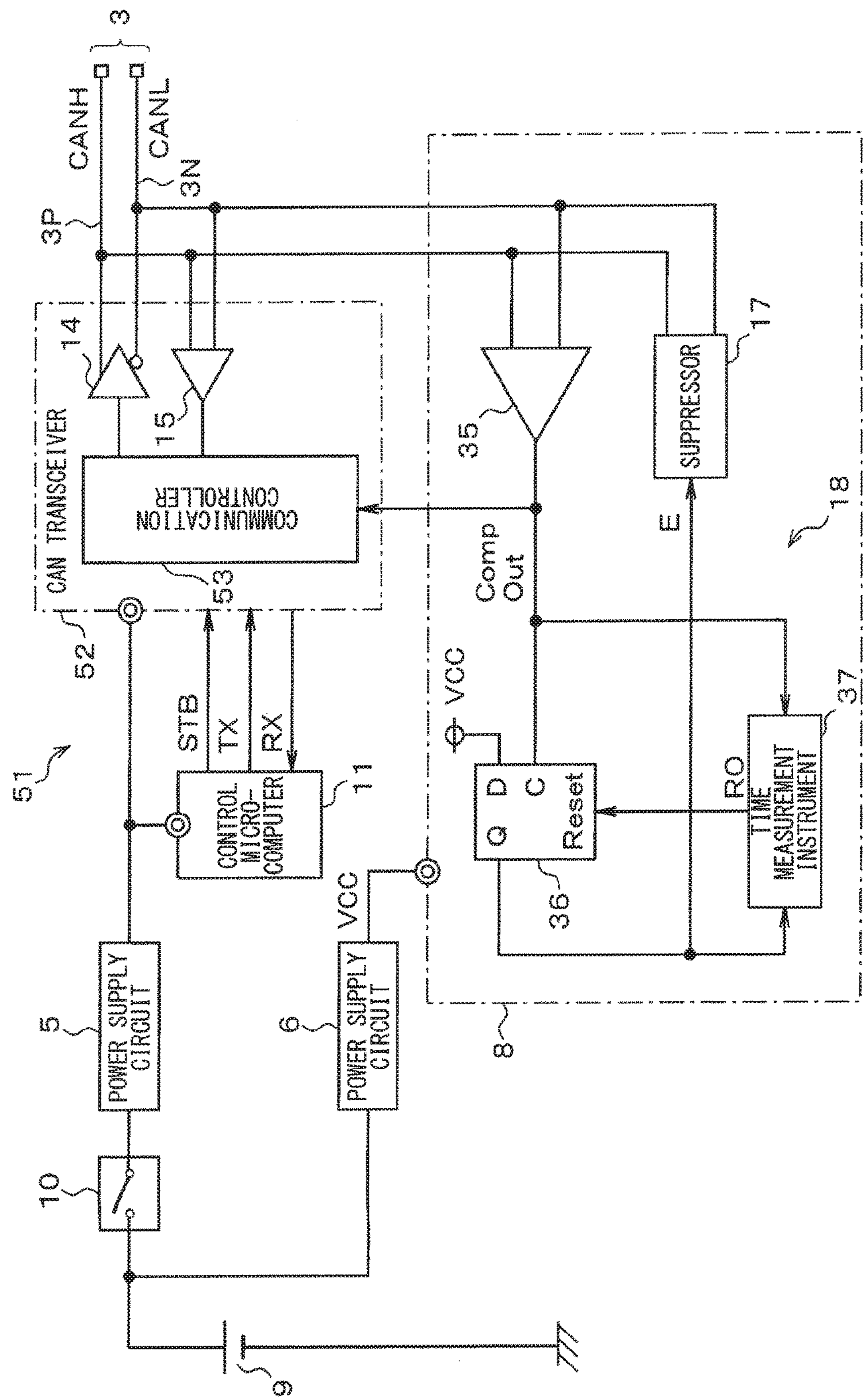
FIG. 9 illustrates the configuration of a node having a ringing suppression circuit according to a second embodiment.

As illustrated in FIG. 9, a CAN transceiver 52 according to the present embodiment does not have the comparator 16, while the CAN transceiver 12 according to the first embodiment has the comparator 16. In this situation, the signal CompOut, which is output from the comparator 35 of the ringing suppression circuit 8, is provided to a communication controller 53. The communication controller 53 determines the presence and absence of the WakeUP pattern based on the signal CompOut.

In this situation, the permanent power supply from the battery is provided to the comparator 35. Accordingly, the present embodiment obtains the effect and operation, which are similar to the one in the first embodiment even when the common comparator 35 are shared by the communication circuit 51 and the ringing suppression circuit 8. According to the present embodiment, the size of the circuit can be reduced by providing a common comparator.

(Third Embodiment)

The third embodiment of the present disclosure is described with reference to FIGS. 10 to 14.

Figure 10:
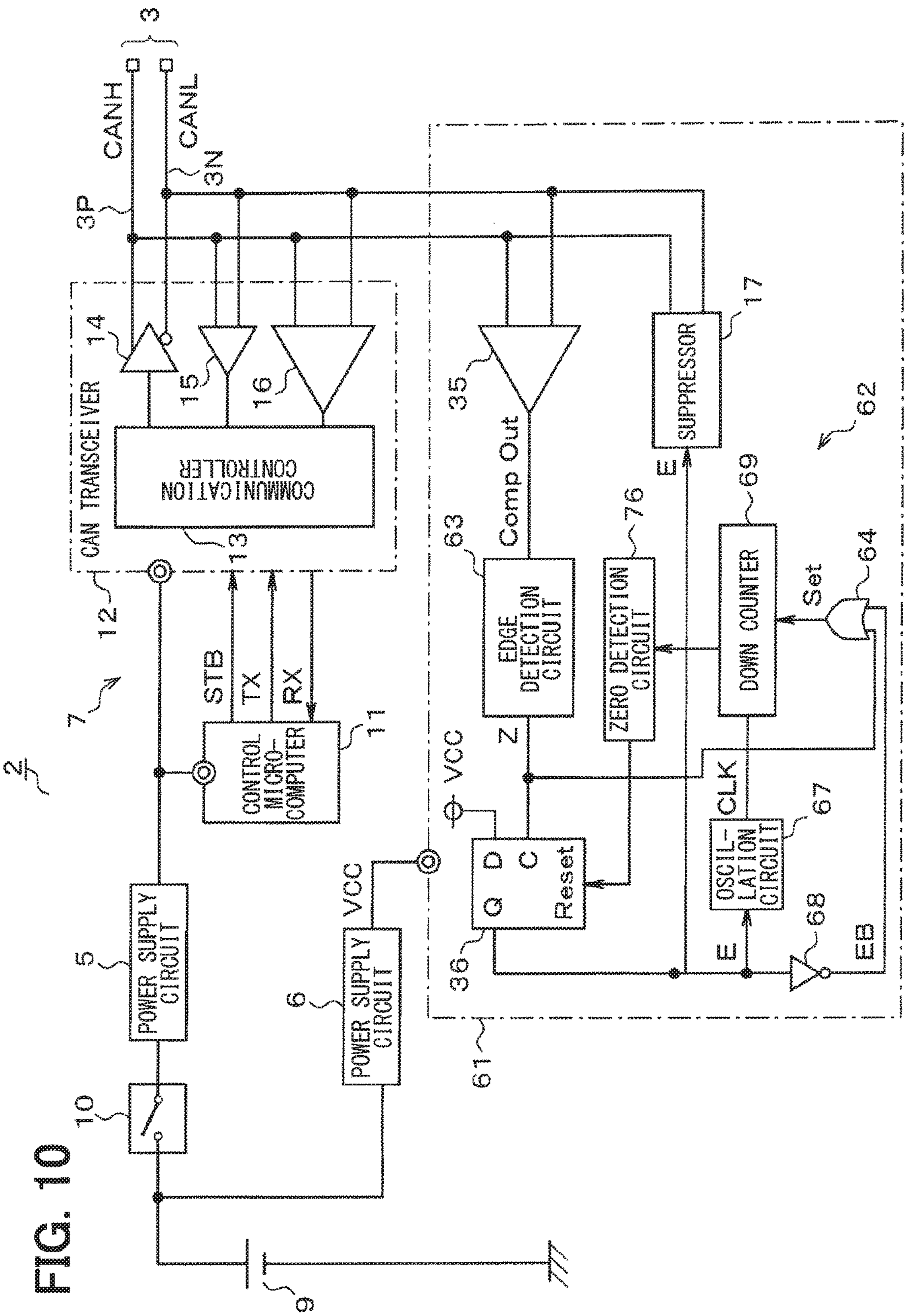
FIG. 10 illustrates the configuration of a node having a ringing suppression circuit according to a third embodiment.

As shown in FIG. 10, an operation controller 62 included in the ringing suppression circuit 61 according to the present embodiment is different from the operation controller 18 according to the first embodiment as described in the following. The operation controller 62 includes the following configuration, which is in replacement of the time measuring instrument 37. When the edge detection circuit 63 detects a rising edge of the signal CompOut, it generates a signal Z as an 1-shot signal with only a predetermined time period. The signal Z is sent to the clock terminal C of the D-F/F 36 and one of the input terminals of an OR circuit 64.

Figure 11:
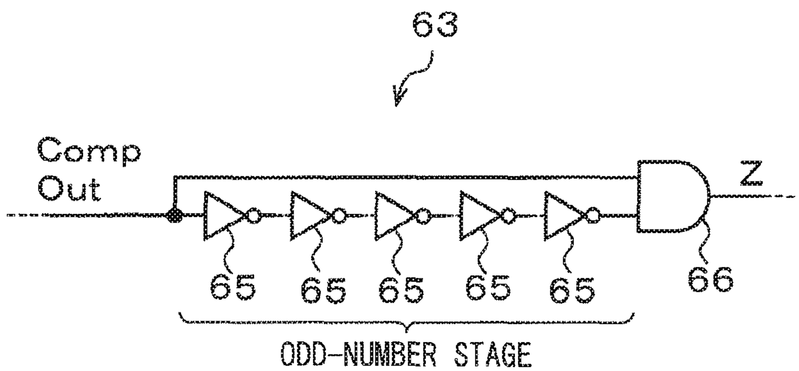
FIG. 11 illustrates the configuration of an edge detection circuit.

For example, as shown in FIG. 11, the edge detection circuit 63 includes inverters 65 with odd-numbered stages (for example, five inverters), which are connected in series, and an AND circuit 66. In this situation, the signal CompOut is sent to an input terminal of the initial-stage inverter 65 and one of the input terminals of the AND circuit 66. The output of the final-stage inverter 65 is sent to the other input terminal of the AND circuit 66. The output of the AND circuit 66 is output to, for example, the D-F/F 36 as the signal Z, which is the 1-shot pulse.

The enable signal E output from the D-F/F 36 is sent to the suppressor 17, an oscillation circuit 67 and an inverter 68. The signal EB output from the inverter 68 is sent to the other input terminal of the OR circuit 64. The output signal of the OR circuit 64 is sent to a down-counter 69 as the signal Set.

Figure 12:
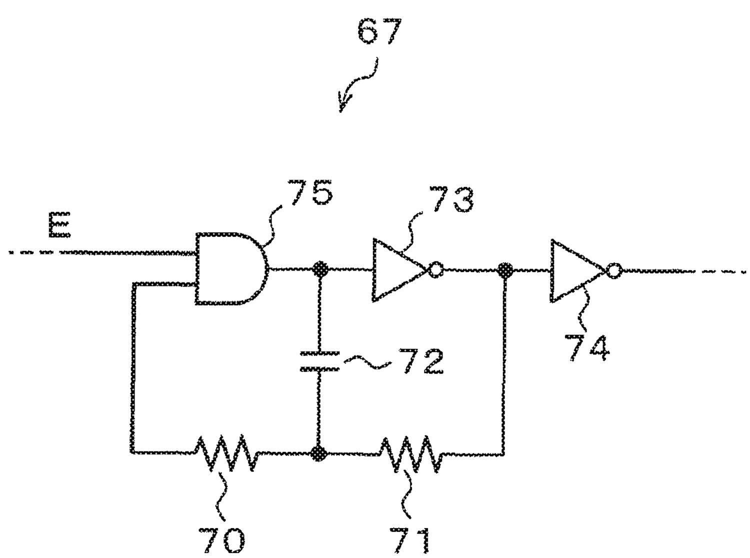
FIG. 12 illustrates the configuration of an oscillation circuit.

The oscillation circuit 67 performs an oscillation operation when the enable signal E is at the high level. The clock signal CLK generated by the oscillation operation in the oscillation circuit 67 is sent to the down-counter 69. For example, as shown in FIG. 12, the oscillation circuit 67 can be configured as an RC oscillation circuit, which includes resistors 70 and 71, a capacitor 72 and inverters 73 and 74. Since the oscillation operation is only executed when the enable signal E is at the high level, the AND circuit 75 is additionally included. One of the input terminals of the AND circuit 75 receives the enable signal E.

The down-counter 69 sets the counting value to a predetermined initial value when the signal Set is changed to be at the high level. In this situation, the initial value is the maximum value of the counting value. The down-counter 69 performs counting from an initial value to zero when the down-counter 69 receives the clock signal CLK and the signal set is at the low level. The counting value of the down-counter 69 is sent to the zero detection circuit 76. When the zero detection circuit 76 receives the counting value indicative of zero, the zero detection circuit 76 outputs the reset signal and reset the D-F/F 36 after the predetermined delay time has been elapsed.

Figure 13:
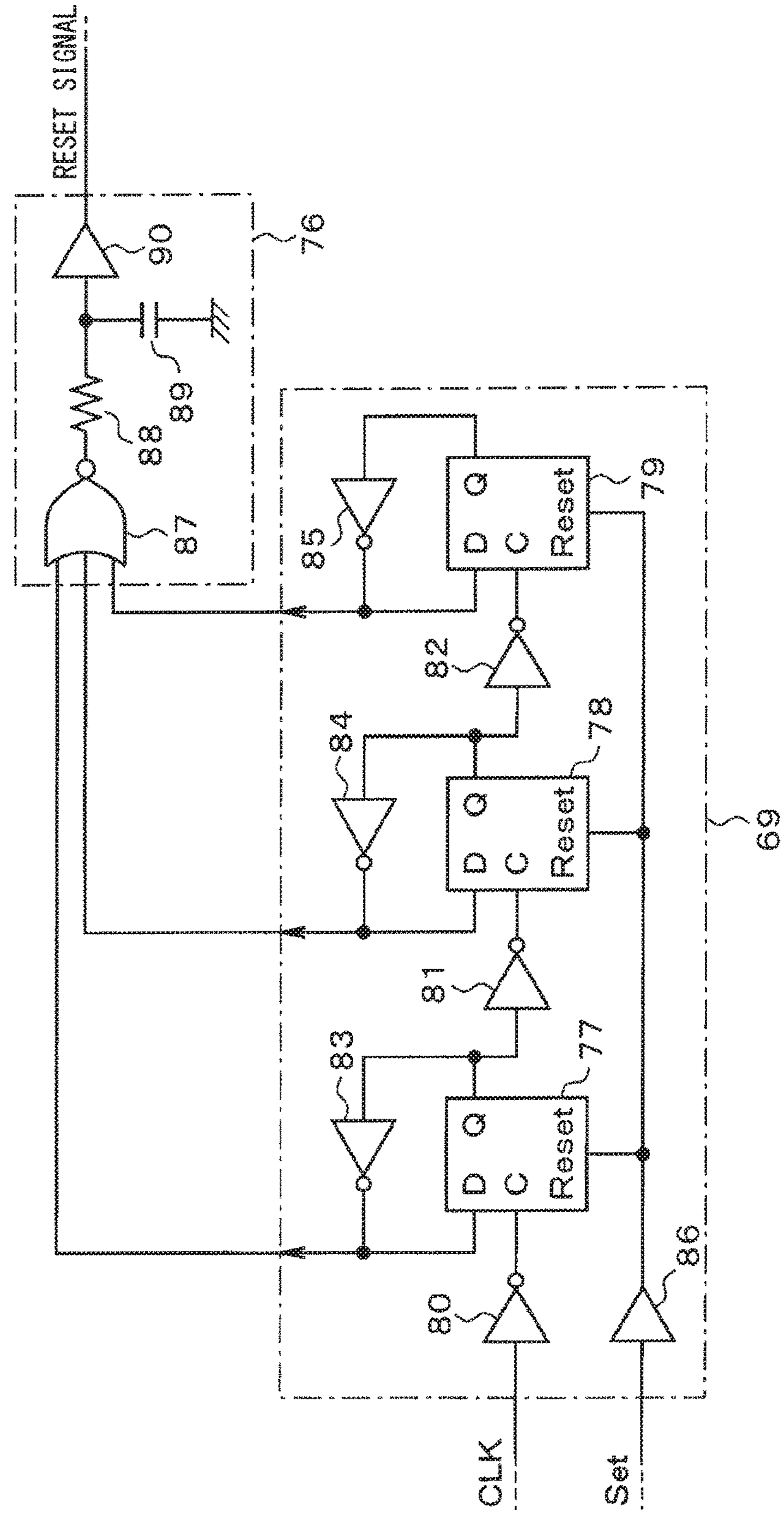
FIG. 13 illustrates the configurations of a down counter and a zero detection circuit.

The particular configuration of the down-counter 69 and the zero detection circuit 76 are illustrated in, for example, FIG. 13. As illustrated in FIG. 13, the down-counter 69 is configured by a 3-bit binary counter. The 3-bit binary counter includes three D-type flip flops 77 to 79, inverters 80 to 85 and a buffer 86. When the signal Set is at the high level, the flip-flops 77 to 79 are all reset, and the output counting value is "111", which is the maximum value.

The zero detection circuit 76 includes a NOR circuit 87, a resistor 88, a capacitor 89 and a buffer 90. Three signals indicative of the counting value are output from the down-counter 69. The three signals are then sent to the NOR circuit 87. The output terminal of the NOR circuit 87 is connected to the ground through the resistor 88 and the capacitor 89. The interconnection point of the resistor 88 and the capacitor 89 is connected to the input terminal of the buffer 90. The buffer 90 digitalizes the voltage at the interconnection point and outputs a binary signal. The output signal is sent to the D-F/F 36 as a reset signal.

According to the above-mentioned configuration, when the counting value "000", that is, the counting value indicative of zero is output from the down-counter 69, the output signal of the NOR circuit 87 is changed to be at the high level. Subsequently, the reset signal is output after a delay time, which is based on the time constant determined by, for example, the resistor 88 and the capacitor 89, has been elapsed, and then the D-F/F 36 is reset.

Figure 14:
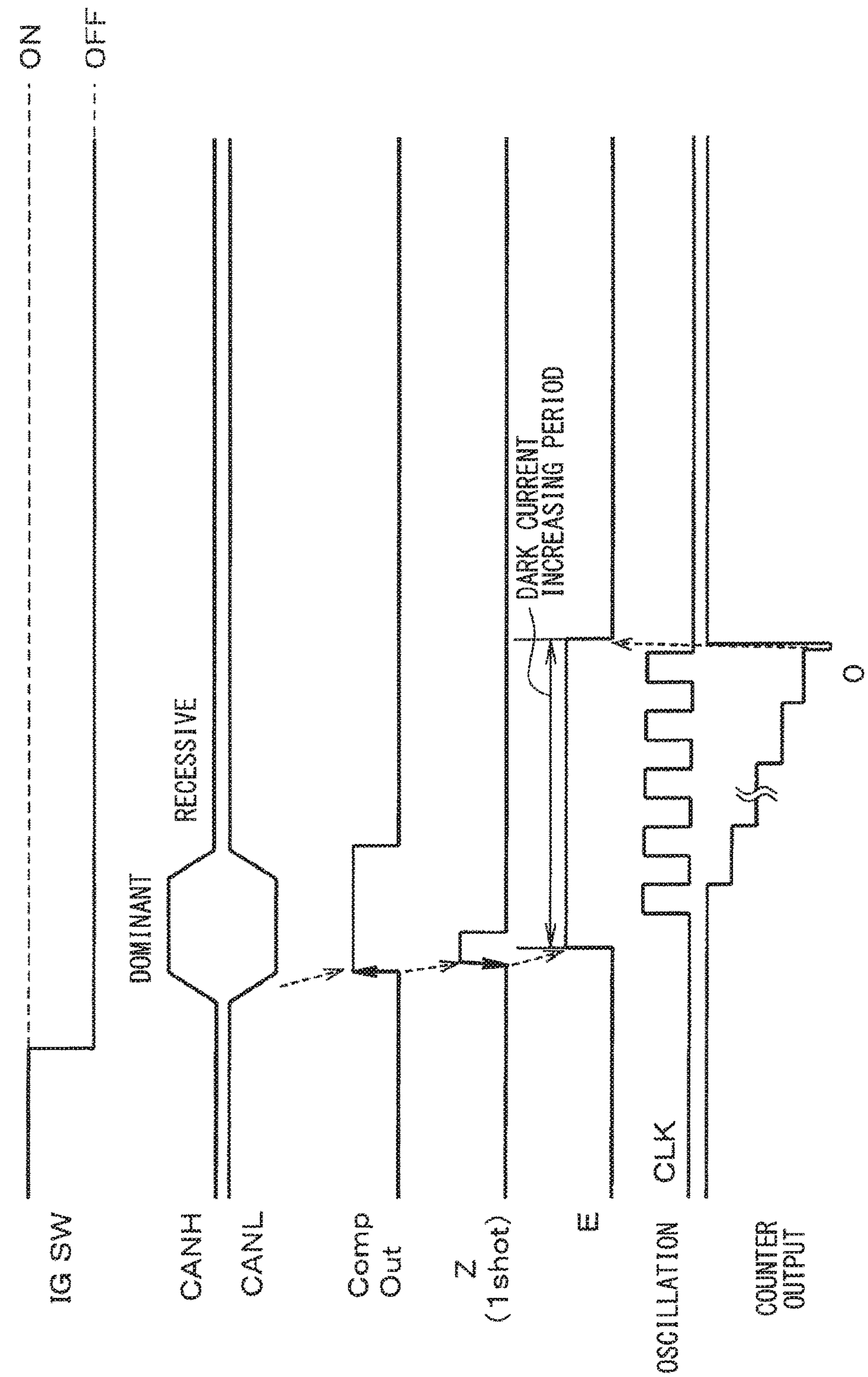
FIG. 14 is a timing chart that illustrates each waveform in a situation where communication is executed when an ignition switch is turned off.

The following describes the timing chart illustrated in FIG. 14 related to the operation of the above configuration.

When the ignition switch is turned off (IGSW: ON→OFF), the power supply switch 10 is also turned off. Thus, the power supply to the communication circuit 7 is cut off. However, the power supply from the power supply circuit 6 is continuously provided to the ringing suppression circuit 8.

When the ignition switch is at the off state, the communication between other nodes 2 is executed so that the communication bus is turned to be at the dominant level from the recessive level. Thus, the signal CompOut is changed to be at the high level. Therefore, the signal Z output from the edge detection circuit 63 is changed to be at the high level, and the enable signal E is turned to be at the high level. Consequently, the suppressor 17 shifts its mode to be the normal mode, and the oscillation operation, which is executed by the oscillation circuit 67, is started. With regard to the above configuration, in a situation where it is determined that the communication is executed on the communication bus when the ignition switch is at the off state, the suppressor 17 shifts its mode to the normal mode and executes the suppression of ringing.

When the signal Z is changed to be at the low level, the down-counter 69 starts the counting operation. The counting operation, which is executed by the down-counter 69, is started. When the counting operation is completed without having a level change in the communication bus from the recessive level to the dominant level, the D-F/F 36 is reset by the zero detection circuit 76. When the enable signal E is changed to be at the low level, the suppressor 17 shifts its mode to the sleep mode. In this situation, the oscillation operation executed by the oscillation circuit 67 is stopped.

According to the above-mentioned configuration, in a situation where it is determined that the communication is not executed on the communication bus when the ignition switch is at the off state, the suppressor 17 shifts its mode to the sleep mode and the oscillation operation executed by the oscillation circuit 67 is stopped. It is aimed to reduce the consumption current. The consumption current, that is, the dark current at this moment is required for the operation of the comparator 35 to determine whether the communication is executed or not on the communication bus.

After the counting operation executed by the down-counter 69 has started, when the communication bus is changed to be at the dominant level from the recessive level, the signal CompOut is changed to be at the high level. Therefore, when the signal Z output from the edge detection circuit 63 is changed to be at the high level, the counting value of the down-counter 69 is reset to be the maximum value.

The present embodiment generates an advantageous effect similar to that of the first embodiment. As described above, according to the present embodiment, the following effects can be obtained. For example, when a fault in which the communication bus is fixed to be at the high level during communication occurs, it is not required to execute the suppression of ringing since the normal communication cannot be executed. With regard to the configuration according to the first embodiment, after it is determined that the communication is continuously executed in a situation where the communication bus is at the dominant level after the communication has started, the suppressor 17 is still at the normal mode even when having a fault. Thus, undesirable current consumption may occur.

In contrast, with regard to the present embodiment, the operation controller 62 determines that the communication has started, then determines that the communication is continuously executed when detecting that the communication bus is changed to the dominant level from the recessive level. Accordingly, according to the present embodiment, when a fault in which the communication is fixed to the dominant level occurs, the suppressor 17 determines that the communication is completed even when the communication bus is still at the dominant level without having a change. Then, the suppressor 17 shifts its mode to the sleep mode. With regard to the present embodiment, even when the fault in which the communication bus is fixed to the dominant level occurs, the suppressor 17 shifts its mode to the sleep mode. As a result, the current consumption in a period when the ringing suppression operation is not required can be further reduced.

(Other embodiments)

It is to be noted that the present disclosure is not limited to the embodiments described above and illustrated in the drawings, and can be arbitrarily modified, combined, or expanded without departing from the scope thereof.

For the configuration of the suppressor 17, it may also be modified as long as the configuration can lower the impedance of the transmission line 3 in response to a change in the differential signal's level so as to suppress the ringing occurred along with the transmission of the differential signal. For example, the suppressor 17 may be configured such that a plurality of switching elements are connected in a series between the signal lines 3P and 3N, as illustrated in FIGS. 1 and 4 of JP 5543402 B2. Or alternatively, the suppressor 17 may also be configured such that a switching element and a resistor are connected in series between the signal lines 3P and 3N. In a situation where the configuration of the suppressor 17 is modified, the configuration of switching the operation state based on the enable signal E may also be modified according to the modification.

The communication protocol is not limited to CAN. Any communication protocol may be applicable as long as the differential signal can be transmitted through a pair of communication lines.

Although the present disclosure has been made in accordance with the embodiments, it is understood that the present disclosure is not limited to such embodiments and structures. Various changes and modification may be made in the present disclosure. Furthermore, various combinations and formations, and other combinations and formations including one or more than one or less than one element may be included in the scope and the spirit of the present disclosure.

The invention claimed is:

1. A ringing suppression circuit provided at one or more nodes, each node having a communication circuit executing communication with another node by transmitting a differential signal through a pair of communication lines connected to the nodes, the ringing suppression circuit comprising:

a suppressor configured to suppress ringing in the differential signal;

an operation controller configured to determine whether the differential signal is transmitted through the pair of communication lines and to shift a mode of the suppressor to a normal-operation mode when the differential signal is transmitted through the pair of communication lines, and to shift the mode of the suppressor to a low-current operation mode when the differential signal is not transmitted through the pair of communication lines, wherein a current consumption of the suppressor is less in the low-current operation mode than the normal-operation mode, wherein the suppressor and the operation controller are configured to permanently receive power from a DC power supply, and wherein the communication circuit is configured to receive power from the DC power supply via a power supply switch.

2. The ringing suppression circuit according to claim 1, wherein the DC power supply is a battery mounted to a vehicle, and wherein the power supply switch is configured to be turned on and off in conjunction with an ignition switch of the vehicle.

3. The ringing suppression circuit according to claim 1, wherein the operation controller is further configured to shift the mode of the suppressor to the low-current operation mode after a predetermined time has elapsed when the differential signal is not transmitted through the pair of communication lines.

4. The ringing suppression circuit according to claim 1, wherein the operation controller includes a comparator; which is configured to detect whether the communication is executed, and wherein the communication circuit is configured to be reactivated in response to the comparator detecting the communication being executed.

5. The ringing suppression circuit according to claim 4, wherein the communication circuit executes the communication according to a CAN protocol, and wherein the operation controller determines that the communication is started in response to detecting a signal level of the differential signal being changed from a recessive level to a dominant level, and then determines that the communication is continuously executed when a signal level of the pair of communication lines is at the dominant level.

6. The ringing suppression circuit according to claim 1, wherein the communication circuit executes the communication according to a CAN protocol, wherein the operation controller determines that the communication is started in response to detecting a change in a signal level of the pair of communication lines, and then determines that the communication is continuously executed in response to a change in the signal level of the pair of communication lines.

7. The ringing suppression circuit according to claim 1, wherein the one or more nodes includes a plurality of nodes, and wherein the ringing suppression circuit is provided to at least one part of the plurality of nodes configured to execute the communication through the pair of communication lines.

8. The ringing suppression circuit according to claim 7, wherein the ringing suppression circuit is provided to at least one part of the plurality of nodes which have no termination.

9. The ringing suppression circuit according to claim 7, wherein the ringing suppression circuit is provided to at least one part of the plurality of nodes which have a higher ringing suppression effect.

10. A ringing suppression circuit provided at one or more nodes, each node having a communication circuit executing communication with another node by transmitting a differential signal through a pair of communication lines connected to the nodes, the ringing suppression circuit comprising:

a suppressor configured to suppress ringing in the differential signal;

an operation controller configured to determine whether the differential signal is transmitted through the pair of communication lines and to shift a mode of the suppressor to a normal-operation mode when the differential signal is transmitted through the pair of communication lines, and to shift the mode of the suppressor to a low-current operation mode when the differential signal is not transmitted through the pair of communication lines, wherein the suppressor and the communication circuit are connected in parallel between the pair of communication lines and a DC power supply, wherein the suppressor is connected to the DC power supply, wherein the communication circuit is connected to the DC power supply through a power supply switch.

* * * * *